United States Patent [19]

Dinger

[11] 4,347,469

[45] Aug. 31, 1982

[54] ELECTRONIC-MAGNETIC CURRENT ISOLATOR CIRCUIT

[75] Inventor: Edward H. Dinger, Waynesboro, Va.

[73] Assignee: General Electric Company, Salem, Va.

[21] Appl. No.: 66,590

[22] Filed: Aug. 14, 1979

[51] Int. Cl.³ .............................................. H02P 1/34
[52] U.S. Cl. ................................... 318/533; 318/512; 318/513
[58] Field of Search ................ 318/513, 56, 332, 326, 318/512, 533; 323/56, 89 R

[56] References Cited

U.S. PATENT DOCUMENTS

| | | | |
|---|---|---|---|
| 1,851,692 | 3/1932 | Zucker | 318/513 |
| 2,039,044 | 4/1936 | Wolfert et al. | 323/56 X |
| 2,468,117 | 4/1949 | Schaelchlin et al. | 318/513 |
| 2,554,203 | 5/1951 | Morgan | 318/513 X |
| 2,652,525 | 9/1953 | Nichols et al. | 318/513 X |
| 2,855,554 | 10/1958 | Conger et al. | 318/513 X |
| 3,135,911 | 6/1964 | Van Allen | 323/56 X |
| 3,295,040 | 12/1966 | Schieman | 318/326 |
| 3,584,282 | 6/1971 | Reeves et al. | 318/332 |
| 3,659,216 | 4/1972 | DePuy | 323/89 R X |

Primary Examiner—Ulysses Weldon
Attorney, Agent, or Firm—Arnold E. Renner; James H. Beusse

[57] ABSTRACT

A circuit provides an electrical output signal proportional to but electrically isolated from a current flowing in a power circuit, and more particularly, to the current supplied to the field or armature winding of a DC motor load which receives power from a rectifier circuit coupled to an AC power source. The circuit includes a transformer including at least two windings, a primary and a secondary, wound on a saturable core. The primary winding is coupled to the power circuit, whereas the secondary winding is coupled to an output circuit along with control circuit means which are adapted to keep the core out of saturation in response to a power current flowing in the primary winding which by itself is adapted to drive the core into saturation. Accordingly, the time the core is not in saturation an output current flows in the secondary winding, which is related to the primary current by the turns ratio of the transformer.

20 Claims, 9 Drawing Figures

TWO CORE, 4 WINDING REACTOR USE WITH CIRCUIT OF FIG. 5

SINGLE CORE, 2 WINDING REACTOR USED WITH CIRCUIT OF FIG. 1

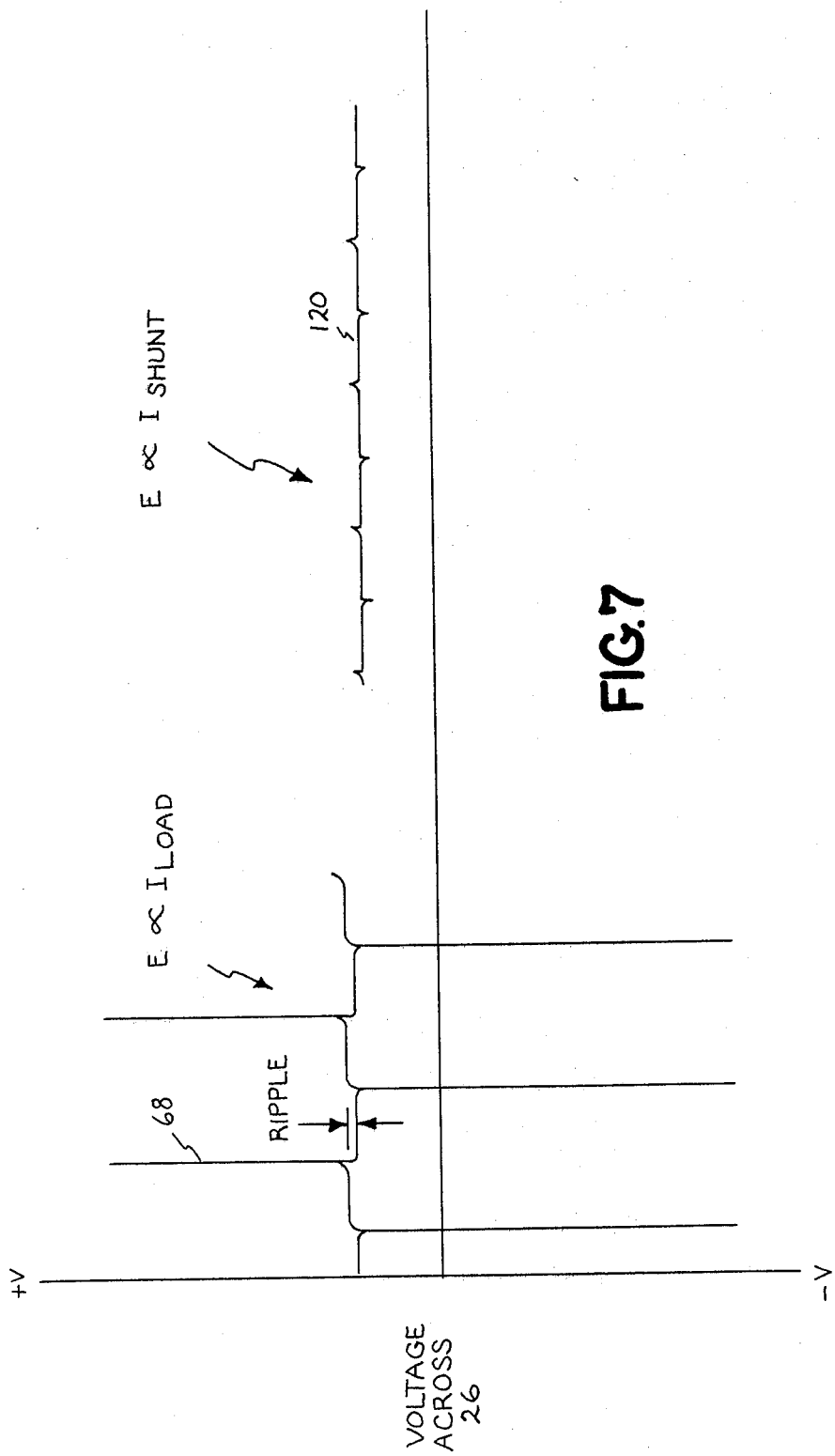

ELECTRONIC-MAGNETIC CURRENT ISOLATOR CIRCUIT

CROSS REFERENCE TO RELATED APPLICATION

The subject invention is related to U.S. Pat. No. 4,283,667 entitled, "Motor Field Exciter," issued on Aug. 11, 1981 in the name of the present inventor, which patent is also assigned to the assignee of this invention.

BACKGROUND OF THE INVENTION

The present invention relates generally to circuitry for detecting and measuring the current supplied to a load, and more particularly to an isolator circuit for providing an output signal to a relatively low power circuit which is proportional to the current supplied to the load from a power circuit.

In a motor drive system where, for example, a DC motor is supplied power from a thyristor type of static converter, control of the motor is achieved by sensing either the motor armature current of field current and generating therefrom a signal indicative of actual motor operation. This signal is then compared to a desired operating condition reference signal, with an error signal being developed therefrom which is utilized to control the thyristor converter. Such systems find wide application and take many different circuit configurations depending upon the specific task contemplated. Because of the relatively large currents which often are encountered on the power side of the motor drive system, it is vitally necessary to be able to sense these currents in a safe and reliable manner. Transformers obviously can fulfill the need where alternating currents are encountered; however, where DC currents are sought to be sensed, more sophisticated means must be resorted to.

SUMMARY OF THE INVENTION

It is, therefore, an object of the present invention to provide an improved means for detecting an AC or DC current flowing in a power circuit.

Another object of the present invention is to provide an improved circuit for providing an electrical output signal proportional to but electrically isolated from the current flowing in a power circuit coupled to a load.

It is a further object to provide an improved circuit for providing an electrical output signal proportional to the current flowing in the field winding of a DC motor.

Yet another object of the present invention is to provide an improved circuit for providing an output signal proportional to the current flowing in the armature winding of a DC motor.

Yet another object of the present invention is to provide an improved circuit for providing an isolated output signal proportional to the voltage in a power circuit in which power circuit a current proportional to the voltage is made available, for example, by means of a resistor connected across the armature voltage of the motor.

These and other objects are accomplished through the provision of a magnetic circuit, including, among other things, a saturable core device in the form of a transformer having one primary winding connected in a power circuit of any impedance over a wide range, including high impedance loads such as the field winding of a DC motor and very low impedance loads such as a shunt in the armature circuit of a DC motor, and at least one secondary winding which is coupled to an outout resistor and other components in a control circuit which is adapted to apply alternate periods, with respect to time, of positive and negative voltages to cause the flux in the saturable core to alternate between positive and negative saturation limits despite the presence of the current in the primary winding which by itself tends to drive the core into saturation in a particular magnetization direction.

The circuit acts to reverse the polarity of voltage applied to the secondary winding as required to maintain the flux in the core between positive and negative saturation limits at all times except for brief periods at the end of positive and negative flux excursions where saturation is allowed to occur. Thus there are provided momentary peaks of current in an output resistor resulting in peaks of voltage across the output resistor which are used by the control circuit to initiate the reversal of voltage applied to the secondary winding and thereby cause the core to come out of saturation and traverse the ampere-turn-flux characteristic in the opposite direction until the core begins to saturate in the new direction. It is because the circuit keeps the core operating between saturation limits essentially all of the time that, except for the effect of core excitation current, the current flowing in the secondary winding and in the output resistor is related to the current flowing in the primary winding by the primary to secondary turns ratio. The output resistor accordingly develops a voltage thereacross which is proportional to but electrically isolated from the current flowing in the primary winding. In a modified embodiment, the magnetic device includes a two core reactor having two additional windings wound thereon which are used for control purposes.

BRIEF DESCRIPTION OF THE DRAWINGS

While the present invention is particularly defined in the claims annexed to and forming a part of this specification, a better understanding can be had from the following description taken in conjunction with the accompanying drawings in which:

FIG. 7 is a set of waveforms illustrative of the respective output voltages developed by the embodiments shown in FIGS. 1 and 5.

DETAILED DESCRIPTION

Figure 1:
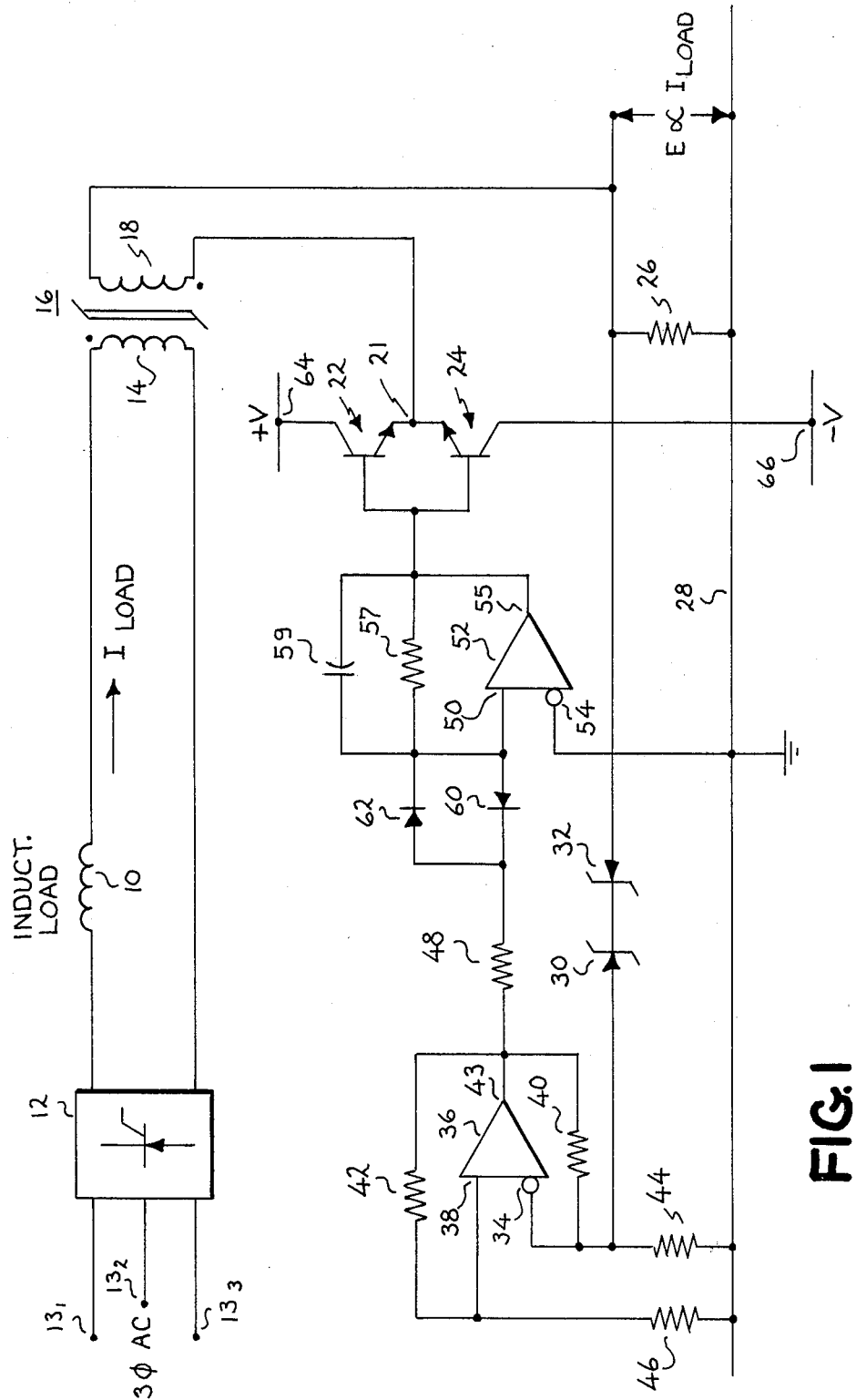
FIG. 1 is an electrical schematic diagram illustrative of the present invention in its preferred embodiment for operation in connection with a high impedance source such as the field winding of a DC motor.
Figure 2:
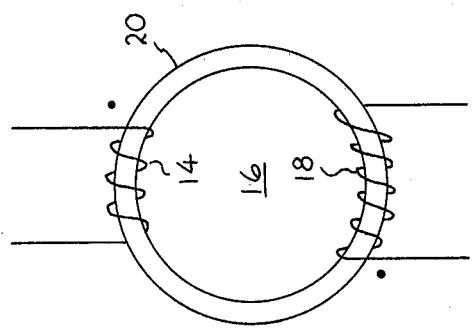
FIG. 2 is an electrical circuit diagram illustrative of a single core two winding magnetic device utilized with the circuit shown in FIG. 1.

Directing attention now to the figures wherein like reference numerals refer to like components throughout, reference is first made to FIG. 1. Shown therein is a circuit according to the subject invention utilized where it is desirable to detect and provide an output signal proportional to the current flowing in a relatively high impedance load such as the field winding of a DC motor. In FIG. 1 a relatively high impedance inductive load member 10 which may be, for example, a DC motor field winding, is coupled to the output of a DC supply source 12 which may be, for example, a well known thyristor bridge converter coupled to a three phase AC power source coupled to terminals $13_1$, $13_2$ and $13_3$. In series with the relatively high impedance inductive load 10 is the primary winding 14 of a saturable core magnetic transformer 16, the details of which are shown in FIG. 2. The transformer additionally includes a secondary winding 18. As shown in FIG. 2, the windings 14 and 18 are wound on a closed magnetic core, e.g., a toroidal core 20 which is comprised of square hysteresis loop high permeability material such as Mu metal. The dots at one end of the windings 14 and 18 constitute polarity dots of like mutual polarity of signals appearing thereacross.

The embodiment shown in FIG. 1 is adapted to sense the DC current flowing in the inductive load 10 in the following manner. One end of the secondary winding 18 is coupled to common circuit connection 21 between the emitters of two transistors 22 and 24 while the opposite end of the winding 18 is connected to one side of a fixed output signal resistor 26. The opposite side of resistor 26 is connected to a point of reference potential shown as a common circuit bus 28, normally grounded. The side of the fixed resistor 26 connected to the secondary winding 18 is also connected to a pair of back-to-back Zener diodes 30 and 32 which couple to the inverting input 34 of an operational amplifier 36. The amplifier 36 also includes a non-inverting input 38. Feedback resistors 40 and 42 are respectively coupled from the output 43 of the amplifier 36 to the inputs 34 and 38. Additionally, the inputs 34 and 38 have respective fixed resistors 44 and 46 coupled to the common bus 28. The ratio of the numerical resistance value of the resistor 46 to that of resistor 42 is selected so as to be lower than the ratio of the resistance values of the resistors 44 and 40. The result of this circuit configuration is that when the voltage across the output signal resistor 26 is low and there is no conduction through Zener diodes 30 and 32, the output of operational amplifier 36 is essentially zero. When, however, the magnetic core of transformer 16 is driven into saturation in either the positive or negative direction, as evidenced by the characteristic curves shown in FIGS. 3A and 3B, the voltage across resistor 26 will go to a relatively high value of either positive or negative polarity depending upon the direction of saturation of the core. The relatively high voltage appearing across the fixed resistor 26 will feed through the Zener diodes 30 and 32 to the inverting input 34 of the amplifier 36 and cause the output voltage of the amplifier 36 to exhibit a predetermined non-zero value. This non-zero value signal, which appears at output 43, is coupled via fixed resistor 48 to the non-inverting input 50 of a second operational amplifier 52 which is configured as a bistable circuit and which is adapted to be switched between two stable states (+) and (−) in response to the non-zero output signal from the amplifier 36.

The bistable circuit including operational amplifier 52 includes a connection of an inverting input terminal 54 to the common bus 28. The output 55 of the amplifier 52 is connected back to the non-inverting input 50 by means of the parallel combination of fixed resistor 57 and a capacitor 59. Additionally, a pair of parallel connected, oppositely poled semiconductor diodes 60 and 62 is series connected between the fixed resistor 48 and the non-inverting input 50.

The output of the amplifier 36 triggers the bistable circuit including amplifier 52 between positive and negative voltage levels which are applied to the bases of transistors 22 and 24 which form a gate circuit. The collectors of transistors 22 and 24 are respectively coupled to voltage supply terminals 64 and 66 which have, respectively, +V and −V supply potentials coupled thereto. Accordingly, depending upon the polarity of the output from the bistable circuit including amplifier 52, one or the other of transistors 22 and 24 will be rendered conductive and gate either a +V or −V supply potential to one end of the secondary winding 18. The switching of the bistable circuit in response to the signal developed across the fixed resistor 26 when the core saturates, moreover, is of a proper direction to cause the proper relative polarity voltage +V or −V to be applied via transistor 22 or 24 to winding 18 in the proper direction to reverse the magnetizing force on the core 20 and to drive the core out of saturation from the direction in which it has just saturated. As a result of the new polarity of voltage being applied to the core, it will eventually saturate in the opposite direction and cause the bistable circuit to reverse and again apply voltage of the first polarity. This will again cause a voltage to be developed across the output resistor 26 of the opposite polarity which will be fed back to the operational amplifier 36 which in turn will operate to trigger the bistable circuit including amplifier 52 to its opposite state. By reference to FIGS. 3A and 3B and 4A and 4B, it becomes apparent that an oscillatory condition is established which maintains the flux in the transformer core between positive and negative saturation limits at all times except for the short periods at each limit when saturation and peak current in resistor 26 resulting from saturation which are used to reverse the voltage applied to the core and so to cause it to promptly come back out of saturation.

Figure 3A:
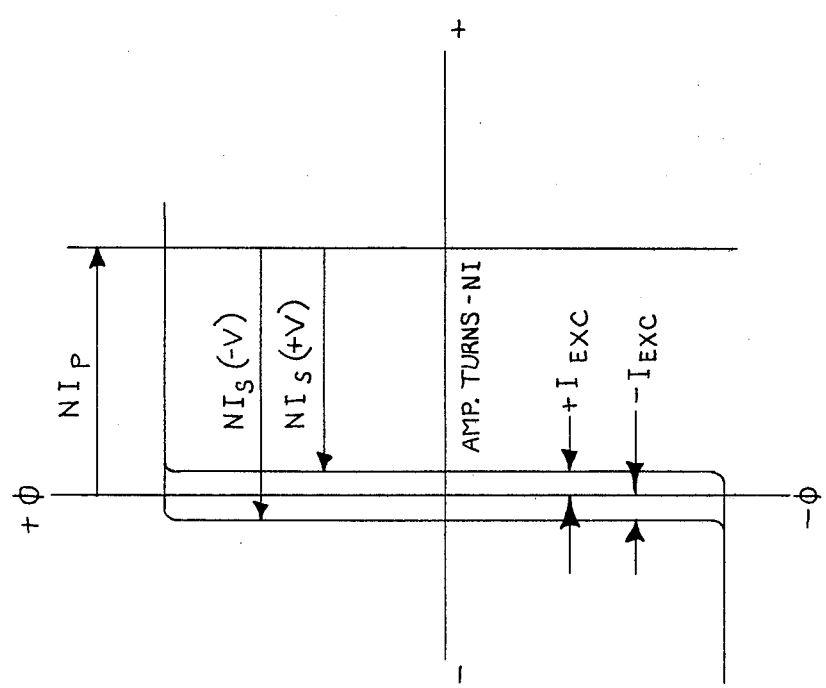
FIGS. 3A and 3B are diagrams illustrative of the saturation characteristics of the magnetic device shown in FIG. 2 for currents applied thereto in opposite directions.
Figure 3B:
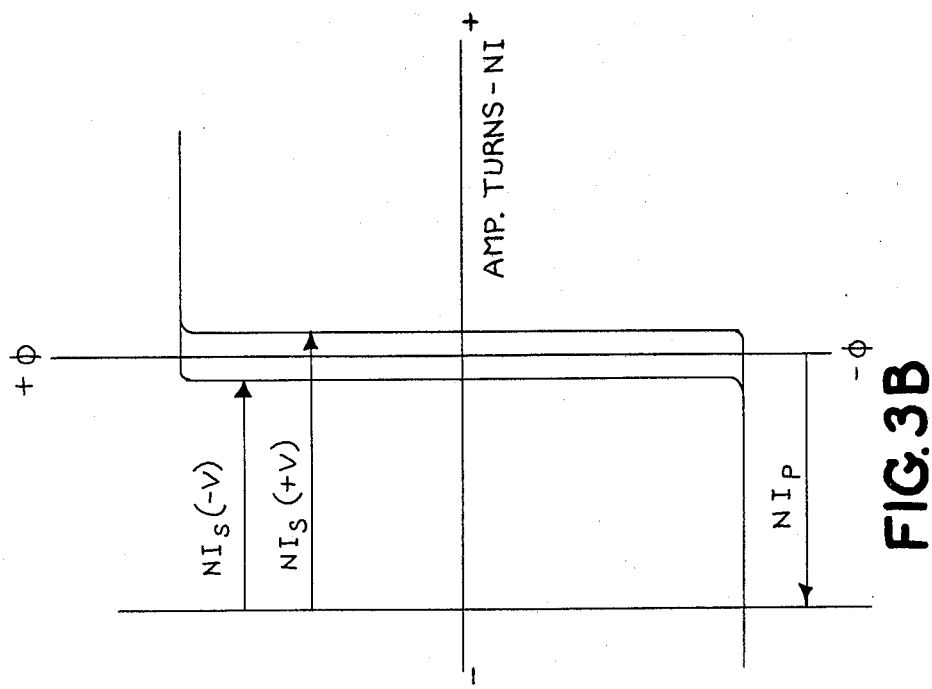

Considering now FIGS. 3A and 3B briefly, FIG. 3A is intended to illustrate the magnetization characteristic or hysteresis curve for a positive current $I_P$ flowing in the primary winding 14 whereas FIG. 3B is intended to illustrate the magnetization characteristic for a negative or opposite polarity current in the same primary winding 14. For example, the ampere turns $NI_p$ for a positive primary current $I_P$ tends to drive the core into saturation in a first (positive) direction while the secondary ampere turns $NI_s$ tends to drive the core in the opposite (negative) direction and it is the difference between the primary and secondary ampere turns that drives the flux in the core 20 from one direction to the other.

Figure 4A:
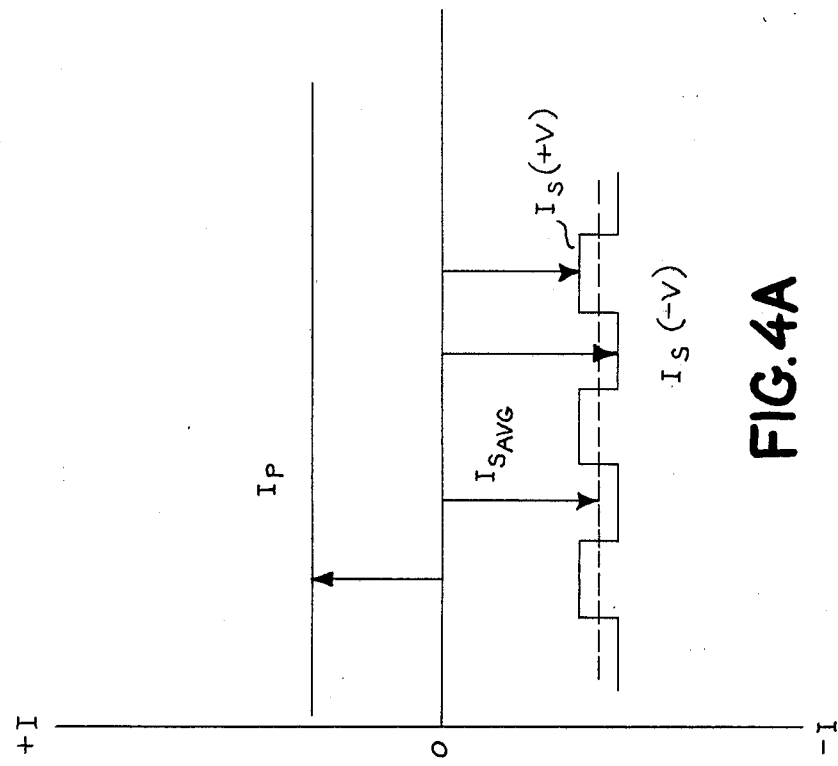
FIGS. 4A and 4B are two sets of waveforms illustrative of the operation of the magnetic device shown in FIG. 2 for currents of opposite directions.
Figure 4B:
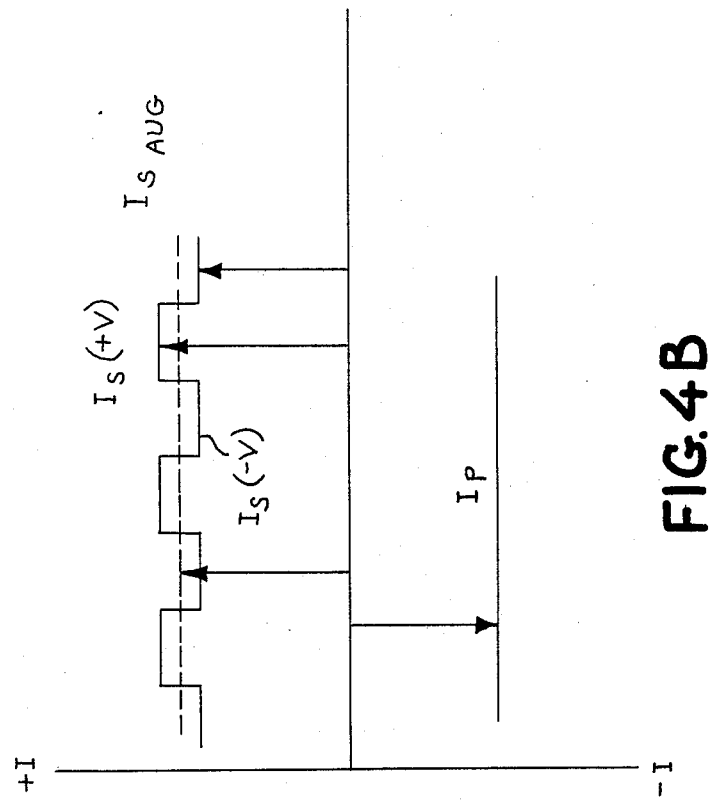

Thus, at all times except at the points of flux excursions when the core saturates briefly, the secondary current ($I_S$) is related to the primary current ($I_P$) defined by the equation:

$$I_S=(N_1/N_2)I_P-I_{EXC}$$

where $N_1/N_2$ is the primary to secondary turns ratio and $I_{EXC}$ is the magnetization current of the core. FIGS. 3A and 4A illustrate the relationship defined by the equation for a positive primary current while FIGS. 3B and 4B depict the relationship for a negative primary current. During the time that the core is not in saturation, which is most of the time, the output or secondary current $I_S$ is related to the primary current $I_P$ which is the current being sensed by the turns ratio $(N_1/N_2)$. It is to be noted that the exciting current is AC, having one polarity $I_S(+V)$ when the flux is going from the negative saturation direction of positive saturation and the other polarity $I_S(-V)$ when the flux is going in the opposite direction. The positive and negative exciting current time periods can be made substantially equal by choosing the resistance value of resistance 26 such that the voltage drop thereacross is relatively small compared to the supply potentials $+V$ and $-V$. Accordingly, most of the exciting current effect can be filtered out. The amount of filtering required and thus the adverse effect it has on speed of response can be minimized by using a closed core or relatively small cross section. This tends to raise the operating frequency and the frequency of the exciting current. The absolute value of the exciting current with respect to the current being sensed can be minimized even before filtering by choosing a high permeability core material and by using sufficient turns on the primary winding 14.

Referring briefly to FIG. 7, waveform 68 is illustrative of the voltage appearing across output resistor 26 which is produced by the current of the secondary winding 18 for a fixed level of current in the primary winding 14. The voltage is seen to be substantially constant except for the effect of exciting current ripple and for sharp voltage peaks at the moments of positive and negative saturation just prior to reversal of the rate of change in the flux and the core. The flux reversals, as noted above, are actually initiated by the sharp voltage peaks of the waveform.

Figure 6:
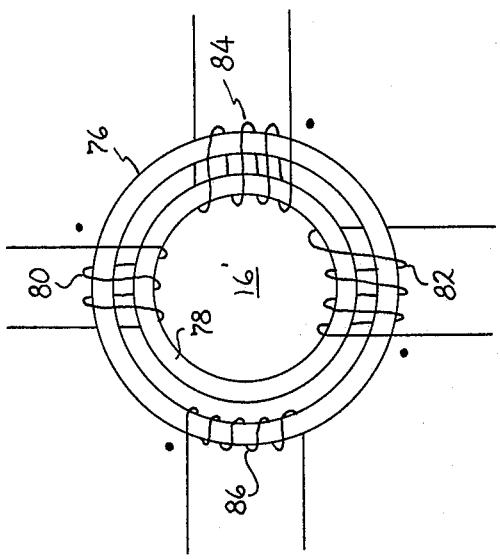
FIG. 6 is an electrical circuit diagram illustrative of a dual core four winding magnetic device utilized with the circuit shown in FIG. 5.

The circuit as disclosed in FIG. 1 has been described considering that the impedance of the inductive load 10 (field winding of a DC motor) when reflected to the secondary side of the transformer 16 is relatively high with respect to that of the output resistor 26. Considering now FIG. 5, there is disclosed an embodiment of the present invention which permits operation for sensing current flow in a relatively low impedance circuit element which may be, for example, a shunt used to sense the direct current flowing in the armature of a DC motor. Accordingly, reference numeral 70 denotes a load consisting of the armature circuit of a DC motor which is series coupled to a low impedance shunt 72. The load is powered from a thyristor bridge converter 12 coupled to a three phase AC line via terminals $13_1$, $13_2$ and $13_3$. The modification involves the use of a dual core four winding saturable core transformer 16' and the addition of a third operational amplifier circuit including amplifier 74 and its associated components coupled between the bistable output of amplifier 52 and the transistors 22 and 24. The transformer 16' is shown in detail in FIG. 6 and is made up of inner and outer toroidal cores 78 and 76, respectively, comprised of square loop high permeability material upon which are wound primary and secondary windings 80 and 82. A third winding 84 is wound upon both cores while a fourth winding 86 is wound only around the outer core 76. Again, the polarity dots indicate winding ends having like instantaneous signal polarities relative to one another.

The additional amplifier 74 (FIG. 5) has a resistor 88 coupling one end of the transformer winding 84 to the inverting input 90 of that amplifier. The opposite end of the winding 84 is connected to the common circuit bus 28 which, as before, is shown connected to ground. A second fixed resistor 92 connected to the inverting input 90 couples the amplifier 74 to the clamped output of amplifier 52. The bistable positive and negative amplitudes of the voltage appearing at output terminal 55 are clamped in both directions by a network consisting of diodes 94, 96, 98 and 100 and Zener diode 102. A resistor 104 is commonly connected from amplifier output 55 to the clamping network and resistor 92. The non-inverting input 106 of amplifier 74 is returned to the common circuit bus 28 and a feedback capacitor 108 is coupled from the output terminal 110 of amplifier 74 back to its inverting input 90. The operational amplifier including amplifier 74 acts to regulate the voltage applied to secondary winding 82 by controlling the conductivity of transistors 22 and 24 so as not to apply the full magnitudes of the $+V$ and $-V$ potential connected to the collectors of transistors 22 and 24 to the winding. The resulting effect of applying the relatively lower counteracting flux voltages to the secondary winding 82 is to minimize an undesirable resulting current that is reflected into the secondary winding from the primary winding 80. Thus, the undesirable current which flows into the output resistor 26 is reduced. The effect of clamping the input to the amplifier 74 further causes the voltage across winding 82 to be held at corresponding equal but smaller values to make the times at which transition between positive and negative core saturation and between negative and positive saturation virtually equal, thus making the ripple frequency symmetrical and relatively easy to filter.

Figure 5:
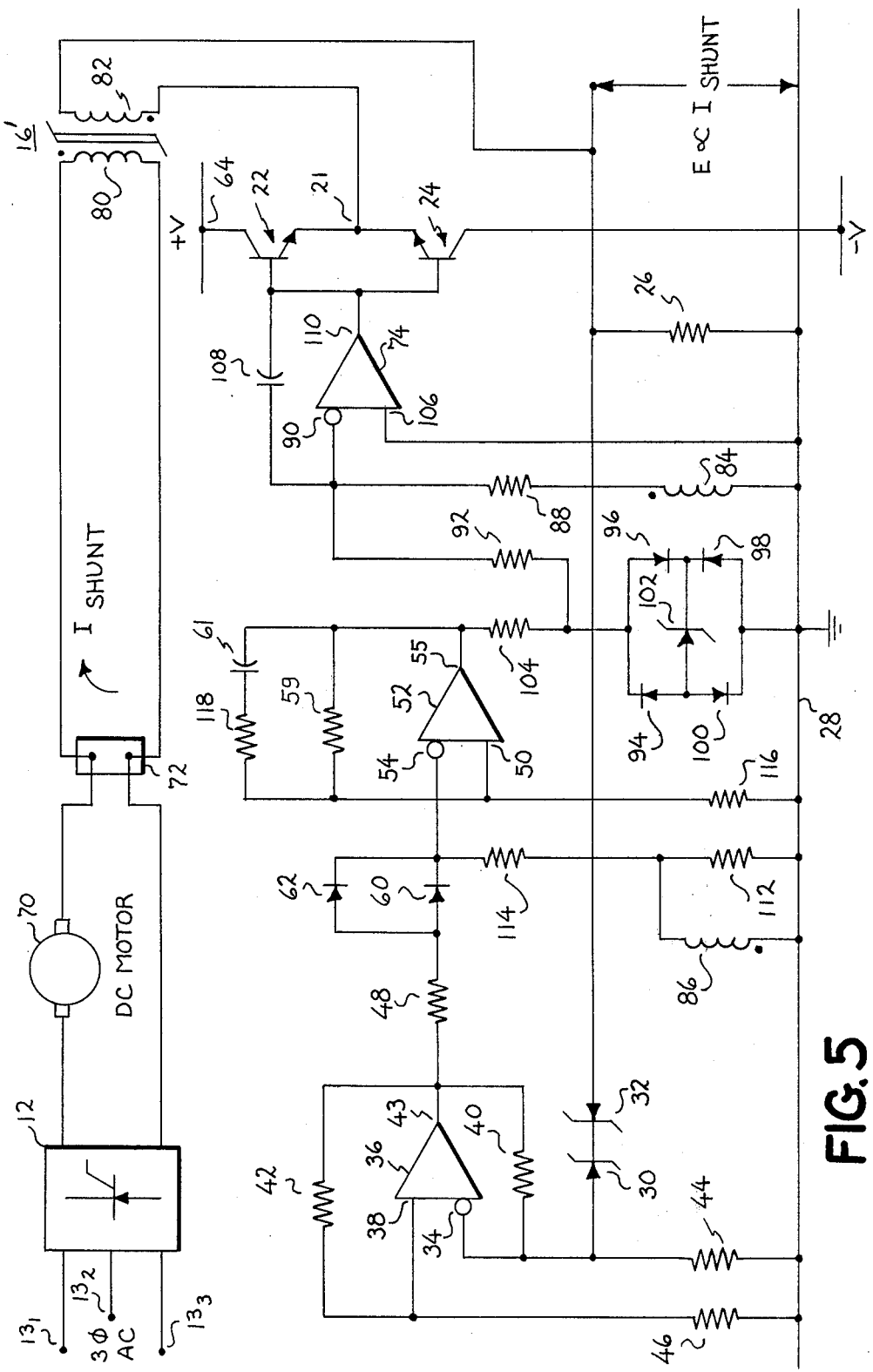
FIG. 5 is a schematic electrical diagram illustrative of the present invention in its preferred embodiment for operation in connection with a low impedance source such as a shunt connected in the armature circuit of a DC motor.

The fourth winding 86 is used to control switching of the bistable circuit without the requirement of a signal voltage appearing across resistor 26 which, as described with reference to the earlier embodiment shown in FIG. 1, acts in combination with the Zener diodes 30 and 32 and amplifier 36 to generate triggering signals at the high current peaks which occur when the core was driven into the positive and negative saturation regions. In the instant embodiment the Zener diodes 30 and 32 remain as do the operational amplifier including amplifier 36 and its associated components. However, this circuitry is utilized merely to assure proper start-up but does not provide any control function during normal operation. As shown in FIG. 5, the winding 86 is coupled to the inverting input 54 of amplifier 52 by means of a parallel resistor 112 and a series resistor 114. The non-inverting input 50 of amplifier 52 is returned to the common circuit bus 28 through a fixed resistor 116. It is to be noted that the signal inputs to amplifier 52 are reversed relative to that in the embodiment shown in FIG. 1. This is due to the inclusion of the regulator amplifier circuitry including amplifier 74 now interposed between the bistable circuit and the gate circuit consisting of transistors 22 and 24. Additionally, the circuit shown in FIG. 5 includes a fixed resistor 118 in series with the capacitor 59 coupled between the output 55 and the non-inverting input 54 in order to improve the switching speed of the bistable circuit.

The bistable switching now controlled by the winding 86 is accomplished in the following manner. Because of the longer flux path length of the outer core 76 (FIG. 6), flux will change only in the shorter path length inner core 78 and not in the longer path length outer core until the inner core approaches saturation. Likewise, the output voltage of winding 86 will be zero, inasmuch as there is no flux change, until the flux begins to change in the outer core just as the inner core approaches saturation. The appearance of these small positive and negative voltage peaks which occur as the inner core approaches positive and negative saturation respectively, are shown in the waveform 120 of FIG. 7. These relatively small positive and negative voltage peaks when applied to the inverting input 54 of amplifier 52 causes the bistable circuit to switch and thus switch the direction of voltage applied to winding 82 by the conduction of either transistor 22 or 24. The end result of the two core circuit configuration shown in FIG. 5 is that it greatly reduces the spikes in the output signal appearing across resistor 26. Since much less filtering of this signal is required, the response is considerably faster than that of the one core circuit shown in FIG. 1.

Thus what have been shown and described are two circuit variations which are adapted to provide electrical output signals proportional to current flowing in high impedance and low impedance circuit elements energized by a power circuit. By the use of a magnetic device including a core structure of square loop high permeability material having one winding that carries the power circuit current to be sensed and a second winding to provide a proportional output current signal, the circuit achieves current proportionality by applying to the second winding alternate periods of positive and negative voltage whose respective time durations cause the flux to alternate between positive and negative saturation limits whereupon the two currents in the respective windings are related to one another by the turns ratio of the device.

While there have been shown and described what are at present considered to be the preferred embodiments of the present invention, modifications thereto will readily occur to those skilled in the art. It is not desired, therefore, that the invention be limited to the specific arrangements shown and described, but it is to be intended to cover all such modifications and alterations which fall within the true spirit and scope of the invention as defined in the appended claims.

What is claimed is:

1. An isolator circuit for providing an isolated output signal proportional to the electrical current flowing in a load supplied by a power circuit, comprising, in combination:
    (a) a load coupled to said power circuit;
    (b) a magnetic device including a primary and a secondary winding wound on a core structure formed from material having a substantially square loop magnetization characteristic, said primary winding being coupled to said load and responsive to the current in said load to drive the core structure in a first magnetizable direction towards saturation;
    (c) an output signal impedance coupled to one end of said secondary winding and being responsive to the current flowing therein to generate said output signal; and
    (d) control circuit means coupled between said output signal impedance and the other end of said secondary winding and being responsive to said output signal to develop and apply to said secondary winding a voltage to drive the core structure toward saturation in a second magnetizable direction opposite from said first direction, whereby an operating condition alternating between positive and negative saturation limits will be established in which current flowing in the secondary winding is proportionally related to the current flowing in the primary winding by the turns ratio between said primary and secondary windings.

2. The isolator circuit as defined by claim 1 wherein said load (a) comprises an electric motor.

3. The isolator circuit as defined by claim 1 wherein said load (a) comprises the field winding of an electrical motor.

4. The isolator circuit as defined by claim 1 wherein said output signal impedance (c) comprises a resistive impedance coupled between said secondary winding and a point of reference potential.

5. The isolator circuit as defined by claim 4 wherein said control circuit means (d) comprises,
    (e) gate circuit means coupled between positive and negative source potentials and operative to apply positive and negative potentials of predetermined magnitudes to said other end of said secondary winding, and
    (f) bistable circuit means having an output coupled to said gate circuit means and being responsive to the magnitude of said output signal to be switched between first and second bistable states thereby causing said gate circuit to alternately apply said positive and negative potentials upon each switching of states of said bistable circuit.

6. The isolator circuit as defined by claim 5 wherein said control circuit means (d) additionally includes,
    (g) switch circuit means coupled between said resistive impedance and said bistable circuit means, being responsive to the magnitude of said output signal appearing across said resistive impedance to generate a switching signal, said switching signal being coupled to said bistable circuit means to cause switching from one of said bistable states to the other.

7. The isolator circuit as defined by claim 6 wherein said control circuit means (d) additionally includes,
    (h) a pair of Zener diodes coupled in back-to-back circuit relationship between said resistive impedance and said switch circuit means.

8. The isolator circuit as defined by claim 7 wherein said gate circuit means (e) comprises,
    (i) a pair of semiconductor devices coupled together between said positive and negative source potentials and having conductivity control electrodes commonly coupled to said output of said bistable circuit means and current output electrodes commonly coupled to said other end of said secondary winding.

9. The isolator circuit as defined by claim 8 wherein said pair of semiconductor devices (i) comprises, a pair of transistors each having base, emitter and collector electrodes and wherein the respective collector electrodes are coupled to said positive and negative source potentials, said base electrodes are commonly coupled to said output of said bistable circuit means and said emitter electrodes are commonly coupled to said other end of said secondary winding.

10. The isolator circuit as defined by claim 6 wherein said bistable circuit means (f) comprises, (j) an operational amplifier having inverting and non-inverting inputs and an output, said output being coupled to said gate circuit means, (k) a parallel network consisting of a resistor and capacitor coupled between said output and a selected one of said inverting and non-inverting inputs, (l) a pair of semiconductor diodes coupled in mutually parallel opposite polarity relationship with respect to one another between said selected one input and said switch circuit means, and (m) means coupling the other input of said inverting and non-inverting inputs to said point of reference potential.

11. The isolator circuit as defined by claim 7 wherein said switching circuit means (g) comprises, (n) an operational amplifier having inverting and non-inverting inputs and an output, said output being coupled to said bistable circuit means, (o) a first feedback signal path including a first resistor connected from said output to one selected input of said inverting and non-inverting inputs, (p) a second resistor coupled from said one selected input to a point of reference potential, (q) a second feedback signal path including a third resistor connected between said output and the other input of said inverting and non-inverting inputs, (r) a fourth resistor coupled between said other input and a point of reference potential, and wherein the ratio of the resistance value of second resistance to said first resistance is relatively lower than the ratio of the resistance value of said fourth resistor to said third resistor, said circuit combination being operable to maintain the signal level of said output at substantially zero potential during non-conduction states of said pair of Zener diodes.

12. The isolator circuit as defined by claim 1 wherein said magnetic device (b) includes a closed core structure and wherein said secondary winding includes a relatively greater number of turns than said primary winding.

13. The isolator circuit as defined by claim 1 wherein the load current is sensed using a relatively low impedance shunt in series with the armature winding of an electric motor.

14. The isolator circuit as defined in claim 1 wherein said magnetic device (b) includes an additional winding wound on said core structure, and wherein said control circuit means (d) includes, (e) gate circuit means coupled between positive and negative source potentials and operative to apply positive and negative potentials of predetermined magnitudes to said other end of said secondary winding, and (f) bistable circuit means having an output coupled to said gate circuit means and an input coupled to said additional winding, said additional winding being responsive to the current flowing in said primary winding to develop and apply a triggering signal to said bistable circuit means for causing said bistable circuit to switch binary states.

15. The isolator circuit as defined by claim 14 wherein said core structure of said magnetic device (b) is comprised of inner and outer toroidal cores and, wherein said primary and secondary windings are wound on both cores and wherein said additional winding is wound only on said outer core.

16. The isolator circuit as defined by claim 15 wherein said control circuit means (d) additionally includes, (g) a bipolar voltage clamp circuit coupled between said bistable circuit means and said gate circuit means.

17. The isolator circuit as defined by claim 16 wherein said control circuit means (d) additionally includes, (h) voltage regulator circuit means coupled between said bistable circuit means and said gate circuit means for controlling the magnitude of said positive and negative potentials applied to said one end of said secondary winding to a relatively lower level than the magnitude of said source potentials depending upon the existing bistable state of said bistable circuit means.

18. The isolator circuit as defined by claim 17 wherein said regulator circuit means (h) includes another additional winding on said core structure, said another winding being wound on said inner and outer cores, and (i) an operational amplifier having at least one input and one output, said input being commonly coupled to said another additional winding and said output of said bistable circuit means and said output being coupled to said gate circuit means.

19. The isolator circuit as defined by claim 17 wherein said gate circuit means (e) comprises, (j) a pair of semiconductor gates coupled together between said positive and negative source potentials and having control electrodes commonly coupled to said output of said bistable circuit means and current output electrodes commonly coupled to said other end of said secondary winding.

20. The isolator circuit as defined by claim 19 wherein said pair of semiconductor gates (j) comprise a pair of transistors each having base, emitter and collector electrodes and wherein the respective collector electrodes are coupled to said positive and negative source potentials, said base electrodes are commonly coupled to said output of said bistable circuit means and said emitter electrodes are commonly coupled to said other end of said secondary winding.

* * * * *